(12) United States Patent
Sharf

(10) Patent No.: US 10,003,144 B1
(45) Date of Patent: Jun. 19, 2018

(54) ELECTRICAL CONNECTOR ASSEMBLY AND CONDUCTIVE ASSEMBLY HAVING AN INTERVENING WALL

(71) Applicant: TYCO ELECTRONICS CORPORATION, Berwyn, PA (US)

(72) Inventor: Alex Michael Sharf, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days. days.

(21) Appl. No.: 15/384,439

(22) Filed: Dec. 20, 2016

(51) Int. Cl.
 *H01R 12/00* (2006.01)
 *H01R 12/71* (2011.01)
 *H01R 13/518* (2006.01)
 *H01R 13/658* (2011.01)
 *H05K 1/11* (2006.01)
 *H05K 1/02* (2006.01)

(52) U.S. Cl.
 CPC ......... *H01R 12/716* (2013.01); *H01R 13/518* (2013.01); *H01R 13/658* (2013.01); *H05K 1/0219* (2013.01); *H05K 1/115* (2013.01)

(58) Field of Classification Search
 CPC .... H05K 1/115; H05K 1/0219; H01R 13/658; H01R 13/518; H01R 12/716
 USPC ............... 439/82, 607.2, 607.21, 567, 607.4, 439/607.35, 607.38, 751
 See application file for complete search history.

(56) References Cited

U.S. PATENT DOCUMENTS

| | | | | |
|---|---|---|---|---|
| 4,681,389 A * | 7/1987 | Nakazawa | ............. | H02B 1/042 439/557 |
| 5,080,611 A * | 1/1992 | Hypes | ...................... | H05K 7/12 439/554 |
| 5,336,111 A * | 8/1994 | Thrush | ............... | H01R 12/7064 439/567 |
| 5,419,713 A * | 5/1995 | Northey | .................... | H05K 7/12 439/567 |
| 6,155,887 A * | 12/2000 | Cuff | ...................... | H01R 12/585 439/751 |
| 6,974,337 B2 * | 12/2005 | Belopolsky | ............ | H01R 12/58 439/751 |
| 7,670,196 B2 * | 3/2010 | Fedder | ................. | H01R 12/585 439/751 |
| 8,092,262 B1 * | 1/2012 | Frederick | ............. | H01R 12/585 439/751 |
| 8,118,602 B2 * | 2/2012 | Beaman | ............... | H01R 12/585 439/66 |

(Continued)

*Primary Examiner* — Abdullah Riyami
*Assistant Examiner* — Nelson R Burgos-Guntin

(57) ABSTRACT

Electrical connector assembly includes an intervening wall configured to be positioned along at least one of a connector side of an electrical connector or another component. The electrical connector assembly also includes a plurality of electrical split contacts positioned along the connector side. Each of the split contacts of said plurality includes first and second fingers extending in a mounting direction to respective distal ends. Each of the first and second fingers includes an inner edge and an outer edge, wherein a receiving gap exists between the inner edges of the first and second fingers. The first and second fingers extend through first and second openings, respectively, of a corresponding opening pair of the intervening wall. The partition segment is disposed within the receiving gap between the first and second fingers.

18 Claims, 4 Drawing Sheets

(56) References Cited

U.S. PATENT DOCUMENTS

| | | | | |
|---|---|---|---|---|
| 8,187,007 B2 * | 5/2012 | Emde | ............... | H01R 12/585 439/751 |
| 8,613,632 B1 * | 12/2013 | Nichols | ............ | H01R 13/6587 439/485 |
| 8,632,346 B2 * | 1/2014 | Wittig | ............... | H01R 4/184 439/553 |
| 8,747,124 B2 * | 6/2014 | Trout | ............... | H01R 12/585 439/751 |
| 8,834,205 B2 * | 9/2014 | Fogg | ............ | H01R 4/64 439/607.21 |
| 8,900,008 B2 * | 12/2014 | Day, Jr. | ............ | H05K 13/04 439/567 |
| 8,992,236 B2 * | 3/2015 | Wittig | ............... | H01R 12/585 439/82 |
| 9,017,103 B2 * | 4/2015 | Davis | ............... | H01R 23/688 439/607.05 |

* cited by examiner

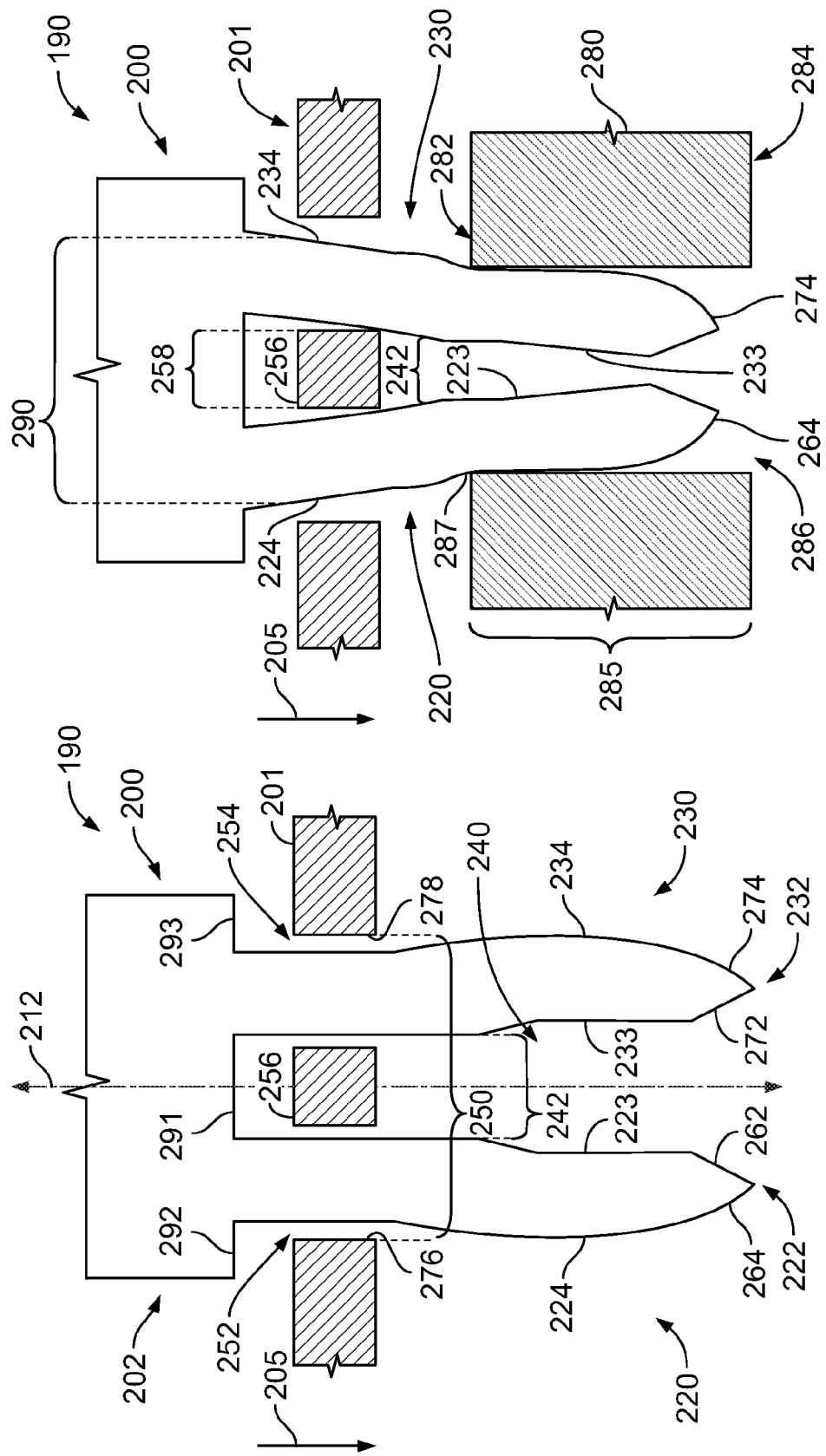

ELECTRICAL CONNECTOR ASSEMBLY AND CONDUCTIVE ASSEMBLY HAVING AN INTERVENING WALL

BACKGROUND

The subject matter herein relates generally to electrical connector assemblies having electrical contacts that are configured to engage another component, such as a circuit board or another electrical connector assembly.

Electrical connector assemblies include electrical contacts that are configured to engage other components. The electrical contacts may communicate data signals therebetween, communicate power therebetween, or provide a ground path for the electrical connector assembly. For example, known electrical connector assemblies include electrical contacts that are referred to as compliant contacts or press-fit contacts. The compliant contacts are configured to mechanically and electrically couple to a circuit board. The circuit board includes a plurality of thru-holes extending through a thickness of the circuit board. The thru-holes are typically "plated" to form plated thru-holes (PTHs) by covering inner surfaces that define the thru-holes with a conductive material, such as copper. Traces or other conductive elements that are connected to the conductive material of the PTHs form electrical pathways from the corresponding PTH to another portion of the circuit board.

To electrically couple the circuit board and the electrical connector assembly, the compliant contacts from the electrical connector assembly are inserted into corresponding PTHs. Each compliant contact engages the conductive material within the PTH. For example, eye-of-needle (EON) contacts include a narrow beam of sheet metal that has a hole stamped therethrough. Outer edges of the EON contact have convex profiles proximate to the stamped hole such that the outer edges arch or bow outwardly. A maximum diameter between the outer edges is slightly larger than a diameter of the PTH. When the EON contact is inserted into the PTH, the outer edges proximate to the stamped hole engage the conductive material of the PTH. The EON contact may be compressed and deformed within the PTH.

In some electrical connector assemblies, the compliant contact is inserted through a hole of an intervening wall. For example, the electrical connector assembly may be an input/output (I/O) receptacle assembly having a receptacle cage that surrounds an interior board connector. The board connector is configured to mate with a pluggable transceiver. The receptacle cage includes compliant contacts that ground the receptacle cage to PTHs of the circuit board. Known receptacle cages include a bottom wall having holes through which the compliant contacts are inserted. The bottom wall is configured to impede electromagnetic interference (EMI) emissions from the board connector and the pluggable transceiver and/or protect the board connector and the pluggable transceiver from external EMI energy. During operation, however, the compliant contacts that extend through the holes may function like antennas and bring unwanted EMI energy into the receptacle cage.

In other electrical connector assemblies, a contact organizer may be used to protect contact terminals that are positioned along a side of an electrical connector. For example, known high-speed connectors include a dense array of signal and ground terminals that form a two-dimensional array along the side of the electrical connector. These signal and ground terminals can be relatively thin and be susceptible to damage. The contact organizer is an intervening wall with holes through which the signal and ground terminals extend. The contact organizer may engage the outer edges of the signal and ground terminals when positioned along the side. Although the contact organizers used today may be effective in protecting the signal and ground terminals from damage, the holes through which the signal and ground contacts extend may allow EMI leakage that compromises electrical performance.

Accordingly, there is a need to reduce EMI leakage into or out of an electrical connector assembly.

BRIEF DESCRIPTION

In an embodiment, an electrical connector assembly is provided that includes an electrical connector having a connector side that is configured to interface with another component. The electrical connector assembly also includes an intervening wall configured to be positioned along at least one of the connector side or the other component. The intervening wall includes a plurality of openings that form opening pairs. Each of the opening pairs includes first and second openings that are separated by a corresponding partition segment of the intervening wall. The electrical connector assembly also includes a plurality of electrical split contacts positioned along the connector side. Each of the split contacts of said plurality includes first and second fingers extending in a mounting direction to respective distal ends. Each of the first and second fingers includes an inner edge and an outer edge, wherein a receiving gap exists between the inner edges of the first and second fingers. The first and second fingers extend through the first and second openings, respectively, of a corresponding opening pair. The partition segment that separates the first and second openings of the corresponding opening pair is disposed within the receiving gap between the first and second fingers.

In some aspects, the inner edges of the first and second fingers are configured to engage the partition segment therebetween. For example, the inner edges of the first and second fingers may engage and pinch the partition segment therebetween when the first and second fingers are deflected toward each other.

In some aspects, the split contacts are stamped from conductive sheet material.

In some aspects, the electrical connector assembly also includes a ground structure. The intervening wall may include a conductive material, and the split contacts may electrically common the ground structure and the intervening wall.

In some aspects, for each of the split contacts of said plurality of split contacts, the outer edges of the first and second fingers are configured to engage respective interior edges of the intervening wall as the first and second fingers are inserted through the first and second openings, respectively.

In some aspects, for each of the split contacts of said plurality of split contacts, the first and second fingers are configured, relative to the partition segment, such that the respective inner edges of the first and second fingers engage the partition segment during a positioning operation when the first and second fingers are inserted through the first and second openings, respectively. The first and second fingers are deflected away from each other as the respective inner edges of the first and second fingers engage the partition segment.

In some aspects, the intervening wall includes interior edges that define the opening pairs. The interior edges are configured to engage the outer edges of the first and second fingers of the split contacts after the first and second fingers are inserted through the first and second openings, respectively. The intervening wall may be collectively supported by the first and second fingers when the first and second fingers are in relaxed conditions and, for example, extend in a gravitational force direction.

In some aspects, the electrical connector includes a receptacle cage and an input/output (I/O) board connector that is surrounded by the receptacle cage and configured to mate with a pluggable connector. The split contacts may be coupled to the receptacle cage and configured to be inserted into plated thru-holes.

In some aspects, the electrical connector includes a contact array along the connector side. The contact array may include non-split contacts and the split contacts. The split contacts may be positioned to electrically separate the non-split contacts along the connector side and configured to be inserted into plated thru-holes. The intervening wall may be a contact organizer.

In an embodiment, an electrical connector assembly configured to be mounted to a circuit board is provided. The electrical connector assembly includes an electrical connector configured to be mounted to a circuit board and a receptacle cage having a module passage that opens to a front end of the receptacle cage. The module passage is configured to receive a pluggable connector during a mating operation. The electrical connector is positioned within the module passage to mate with the pluggable connector during the mating operation. The electrical connector assembly also includes an intervening wall positioned along a bottom of the receptacle cage. The intervening wall includes a plurality of openings that form opening pairs. Each of the opening pairs includes first and second openings that are separated by a corresponding partition segment of the intervening wall. The receptacle cage includes a plurality of electrical split contacts along the bottom of the receptacle cage that are configured to be inserted into plated thru-holes of a circuit board. Each of the split contacts of said plurality includes first and second fingers extending to respective distal ends. Each of the first and second fingers includes an inner edge and an outer edge, wherein a receiving gap exists between the inner edges of the first and second fingers. The first and second fingers extend through the first and second openings, respectively, of a corresponding opening pair. The partition segment that separates the first and second openings of the corresponding opening pair are disposed within the receiving gap between the first and second fingers. Optionally, the intervening wall may be electrically conductive.

In an embodiment, a conductive assembly is provided that includes a plurality of electrical split contacts in which each of the electrical split contacts includes first and second fingers extending to respective distal ends. Each of the first and second fingers includes an inner edge and an outer edge. A receiving gap exists between the inner edges of the first and second fingers. The conductive assembly also includes an intervening wall having a plurality of openings that form opening pairs. Each of the opening pairs includes first and second openings that are separated by a corresponding partition segment of the intervening wall. The intervening wall is electrically conductive. For each of the electrical split contacts of said plurality of electrical split contacts. The first and second fingers of a corresponding electrical split contact extend through the first and second openings, respectively, of a corresponding opening pair. The partition segment that separates the first and second openings of the corresponding opening pair is disposed within the receiving gap between the first and second fingers of the corresponding electrical split contact.

In some aspects, the conductive assembly also includes a cage that includes a cage wall. The cage wall having the plurality of electrical split contacts.

In an embodiment, an electrical connector assembly is provided that includes a connector body having a mating side and a mounting side and signal and ground conductors extending through the connector body between the mating and mounting sides. The signal and ground conductors have signal and ground terminals, respectively, that are positioned along the mounting side and configured for insertion into plated thru-holes of a circuit board. The electrical connector assembly also includes an intervening wall disposed along the mounting side. The intervening wall includes a plurality of openings that form opening pairs. Each of the opening pairs includes first and second openings that are separated by a corresponding partition segment of the intervening wall. At least a plurality of the ground terminals are split contacts. Each of the split contacts includes first and second fingers extending in a mounting direction to respective distal ends. Each of the first and second fingers includes an inner edge and an outer edge, wherein a receiving gap exists between the inner edges of the first and second fingers. The first and second fingers extend through the first and second openings, respectively, of a corresponding opening pair. The partition segment that separates the first and second openings of the corresponding opening pair being disposed within the receiving gap between the first and second fingers.

BRIEF DESCRIPTION OF THE DRAWINGS

FIG. 3 is a side view of a conductive assembly having an electrical split contact and an intervening wall formed in accordance with an embodiment.

FIG. 4 is a side view of the conductive assembly of FIG. 3 after the split contact has operably engaged another component.

DETAILED DESCRIPTION

Figure 1:
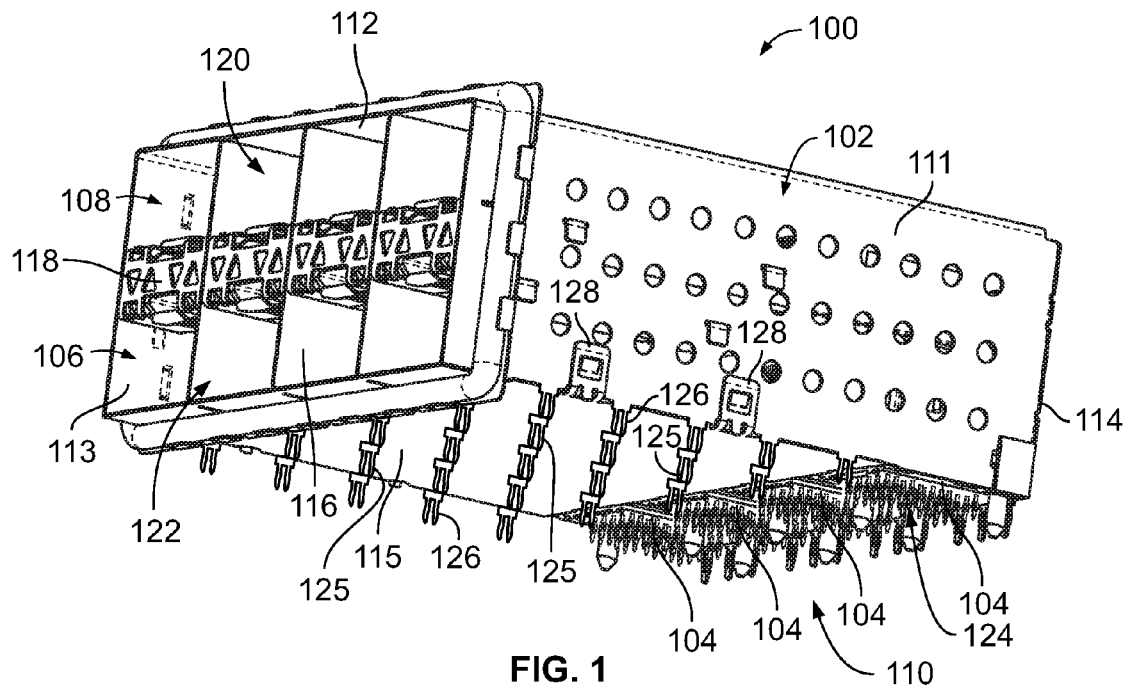
FIG. 1 is a perspective view of an electrical connector assembly that may include electrical split contacts formed in accordance with an embodiment.

Embodiments set forth herein include electrical connector assemblies having electrical split contacts and intervening walls through which the split contacts extend and may couple to. In some embodiments, the electrical connector assembly may be a receptacle assembly that is configured to mate with an input/output (I/O) pluggable connector (or pluggable transceiver). The receptacle assembly and the pluggable connector may be consistent with one or more industry standards, such as a small-form factor pluggable (SAT), enhanced SFP (SFP+), quad SFP (QSFP), C form-factor pluggable (CFP), and 10 Gigabit SFP, which is often referred to as XFP. In such embodiments, the intervening wall may be a conductive element or shield that is disposed along a bottom of the receptacle assembly. The conductive element may be electrically coupled to a receptacle cage that houses one or more board connectors. The conductive element and the receptacle cage may cooperate in impeding the leakage of electromagnetic interference (EMI) emissions from the receptacle assembly and/or protect the receptacle assembly and the pluggable connector from external EMI energy.

In other embodiments, the electrical connector assembly may be a part of a circuit board assembly used in backplane or midplane communication systems. For example, the circuit board assembly may be a backplane assembly having a mother board and a plurality of the electrical connector assemblies mounted thereto. Such electrical connector assemblies may include electrical connectors called header connectors. Alternatively, the circuit board assembly may be a daughter card assembly having a daughter card and one or more electrical connector assemblies mounted thereto that engage the backplane assembly. Such electrical connector assemblies may include electrical connectors called receptacle connectors. Yet in other embodiments, the electrical connector assembly may be mounted to a host board having a plurality of other communication components mounted thereto.

For both header and receptacle connectors, a side of the electrical connector may include an array of contact terminals that are exposed to an exterior of the electrical connector. An intervening wall, which is referred to as a contact organizer, may be positioned along the side of the electrical connector. The contact organizer is configured to protect the contact terminals during shipping and during a mounting operation in which the contact terminals are inserted into respective plated thou-holes of a circuit board. More specifically, the contact organizer may reduce the likelihood of the contact terminals being damaged as the electrical connector is mounted to the circuit board.

Although embodiments described herein include receptacle assemblies and electrical connector assemblies with header connectors or receptacle connectors, it should be understood that embodiments are not limited to these applications. Other embodiments may utilize an intervening wall that electrically commons conductive structures and/or protects contact terminals.

As used herein, the phrase "a plurality of [elements]" and the like, when used in the detailed description and claims, does not necessarily refer to each and every one of the elements that a component (e.g., electrical connector assembly, a receptacle cage, intervening wall, conductive element, or conductive assembly) may have. For example, the phrase "a plurality of electrical split contacts" does not necessarily include each and every electrical split contact of the larger component (e.g., electrical connector assembly, a receptacle cage, intervening wall, conductive element, or conductive assembly). To provide one example, a first plurality of electrical split contacts of a ground wall may receive corresponding partition segments of an intervening wall, but a second plurality of electrical split contacts of the ground wall may not receive corresponding partition segments. Accordingly, unless explicitly stated otherwise (e.g., "each and every electrical split contact of the [component]"), embodiments may include similar elements that do not have the recited features or relationships with other parts of the component.

FIG. 1 is a front perspective view of an underside of an electrical connector assembly 100. The electrical connector assembly 100 includes a receptacle cage 102 and a plurality of board connectors 104. The receptacle cage 102 includes a plurality of module passages 106 that open to a front end 108 of the receptacle cage 102. Each of the module passages 106 is configured to receive a corresponding I/O pluggable connector (not shown) during a mating operation. The board connectors 104 are positioned within respective module passages 106 to mate with corresponding pluggable connectors.

In the illustrated embodiment, the electrical connector assembly 100 includes multiple board connectors 104 in which each board connector 104 is a multi-port board connector that is configured to mate with two pluggable connectors. In other embodiments, however, the electrical connector assembly 100 may include only one board connector or a plurality of single-port board connectors. The receptacle cage 102 and the board connectors 104 are configured to be mounted to a circuit board (not shown), such as the circuit board 280 (shown in FIG. 4).

The receptacle cage 102 may be stamped and formed from one or more sheets of conductive material (e.g., sheet metal). As shown, the receptacle cage 102 has a bottom 110 and includes a plurality of interconnected cage walls 111, 112, 113, 114, 115, and 116. The cage walk 111-115 are outer cage walls that define an exterior of the receptacle cage 102. More specifically, the outer cage walls include a pair of side walls 111, 113, a top wall 112 that extends between the side walls 111, 113, a rear wall 114, and a bottom wall 115. The top wall 112 is opposite the bottom 110, which may be defined by the bottom wall 115 and bottom surfaces 124 of the board connectors 104. The bottom surfaces 124 may also be referred to as connector sides. As shown, the bottom surfaces 124 of the board connectors 104 are exposed and do not overlap with the bottom wall 115. In other embodiments, however, the bottom wall 115 may cover at least portions of the bottom surfaces 124.

The bottom wall 115 may also be referred to as an intervening wall. In the illustrated embodiment, the bottom wall 115 includes coupling tabs or clasps 128. The coupling tabs 128 are configured to couple the bottom wall 115 to the receptacle cage 102. The cage walls 116 are inner cage walls that define an interior of the receptacle cage 102. More specifically, the inner cage walls 116 define the module passages 106. The cage walk 111, 112, 113, 115, and 116 define a plurality of upper ports 120 and a plurality of lower ports 122. A plurality of dividers 118 are secured to the inner cage walls 116. Each divider 118 separates an upper port 120 from a respective lower port 122.

The receptacle cage 102 may include a plurality of electrical contacts 125, 126. In the illustrated embodiment, the electrical contacts 125, 126 are compliant contacts that are configured to be inserted into plated thru-holes of the circuit board (not shown) to mechanically and electrically engage the circuit board. The electrical contacts 125 may be split contacts that are similar to or identical to the electrical split contacts 200 shown in FIG. 3. The electrical contacts 126 may be eye-of-needle (EON) contacts. As described herein, the electrical contacts 125 may be configured to mechanically and electrically, engage the bottom wall 115 to reduce EMI egress or ingress through holes of the bottom wall 115.

Figure 2:
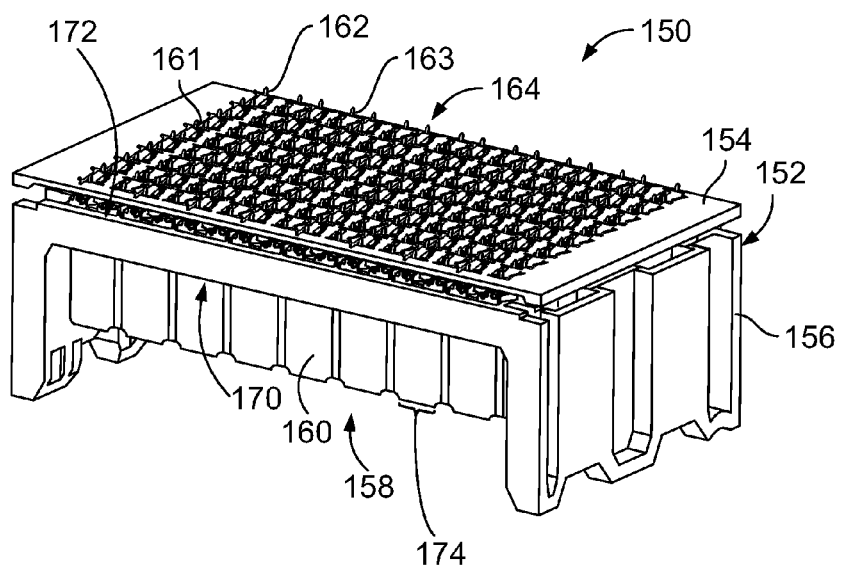
FIG. 2 is a perspective view of an electrical connector assembly that may include electrical split contacts formed in accordance with an embodiment.

FIG. 2 is a perspective view of an electrical connector assembly 150 formed in accordance with an embodiment that includes an electrical connector 152 and an intervening wall 154. The electrical connector 152 is hereinafter referred to as a header connector, and the intervening wall 154 is hereinafter referred to as a contact organizer. The contact organizer 154 is coupled to the header connector 152 in a pre-loaded position in FIG. 2. The header connector 152 includes a connector body 156 and a conductor array 158 of electrical conductors 160, 162 that are coupled to the connector body 156. The electrical conductors 160, 162 include signal conductors 162 that are configured to transmit data signals therethrough and ground conductors 160 that are configured to shield the signal conductors 162. In the pre-loaded position, the contact organizer 154 is engaged to ground terminals 161 of the ground conductors 160, which collectively hold the contact organizer 154 through frictional forces. During a mounting operation, the contact organizer 154 is displaced toward the connector body 156. The electrical connector assembly 150 is configured to mate with another electrical connector (not shown).

The connector body 156 has first and second connector sides 170, 172. The first connector side 170 is a mating side that is configured to interface with another connector. The second connector side 172 is a mounting side that is configured to interface with a circuit board (not shown), such as the circuit board 280 (shown in FIG. 4). The circuit board may be, for example, a motherboard or a daughter card. The ground and signal conductors 160, 162 include ground and signal terminals 161, 163, respectively, that are exposed along the mounting side 172. The ground and signal terminals 161, 163 form a contact or terminal array 164.

In the illustrated embodiment, the mating and mounting sides 170, 172 face in opposite directions. In other embodiments, however, the electrical connector assembly 150 may have a right-angle configuration in which the mating and mounting sides 170, 172 face in directions that are perpendicular to each other. When the electrical connector assembly 150 is mated to the other connector, the mating side 170 may directly engage the other connector. When the mounting side 172 is mounted to the circuit board, the contact organizer 154 is positioned between the mounting side 172 and the circuit board.

In particular embodiments, the signal conductors 162 are configured for differential signal communication. For example, the signal conductors 162 may be arranged in pairs in which each pair is surrounded by a corresponding ground conductor 160 to form a contact assembly 174. The ground conductor 160 may be C-shaped or U-shaped. The header connector 152 may include a plurality of such contact assemblies 174. For example, the header connector 152 has an 8×6 array of the contact assemblies 174. In the illustrated embodiment, the header connector 152 is a vertical header connector. The other connector may be a receptacle connector configured to mate with the header connector. The other connector may be vertically oriented or, alternatively, may have a right-angle type configuration.

The electrical connector assembly 150 may be used in various applications. By way of example only, embodiments may be used in telecom and computer applications, routers, servers, supercomputers, and uninterruptible power supply (UPS) systems. The electrical connector assembly 150 may be used with backplane (or midplane) assemblies or daughter card assemblies that are configured to engage the backplane assemblies. One or more of the electrical connector assemblies 150 described herein may be similar to electrical connector assemblies of the STRADA Whisper or Z-PACK. TinMan product lines developed by TE Connectivity. For example, the signal conductors of the electrical connector assemblies may be capable of transmitting data signals at high speeds, such as 10 gigabits per second (Gb/s), 20 Gb/s, 30 Gb/s, or more. In more particular embodiments, the signal conductors may be capable of transmitting data signals at 40 Gb/s, 50 Gb/s, or more. For some applications, the electrical connector assemblies may include high-density, two-dimensional arrays of signal terminals. A high-density array may have, for example, at least 12 signal terminals per 100 mm². In more particular embodiments, the high-density array may have at least 20 signal terminals per 100 mm².

FIG. 3 is a side view of a conductive assembly 190 having an electrical split contact 200 and a portion of an intervening wall 201. Although the conductive assembly 190 has only one split contact 200 in FIG. 3, it should be understood that the conductive assembly 190 may include a plurality of electrical split contacts 200. The electrical split contacts 200 may be parts of a common structure (e.g., a cage wall) or may be physically discrete elements. The split contact 200 may be similar or identical to the electrical contacts 125 (FIG. 1) or the ground terminals 161 (FIG. 2). The intervening wall 201 may be similar or identical to the bottom wall 115 (FIG. 1) or the contact organizer 154 (FIG. 2). In some embodiments, the split contact 200 is stamped and formed from a sheet of conductive material, such as sheet metal, to include the features described herein. However, the split contact 200 is not required to be manufactured using a particular process or processes. The split contact 200 as shown in FIG. 3 represents the split contact 200 in an operative condition in which the split contact 200 is ready for insertion into a corresponding plated thru-hole (not shown), such as the plated thru-hole 286 (FIG. 4). The intervening wall 201 may be held in position by the split contacts 200 and/or by other means. For example, the coupling tabs 128 (FIG. 1) may hold the bottom wall 115 (FIG. 1) in position prior to the electrical connector assembly 100 (FIG. 1) being mounted to a circuit board.

The conductive assembly 190 may be used in a variety of applications. In some embodiments, the split contact 200 is configured to operate as a ground contact and electrically couple the intervening wall 201 to a ground structure of an electrical connector assembly. In other embodiments, however, the conductive assembly 190 may be used to transmit power. In such embodiments, the split contact 200 may electrically couple to the intervening wall 201 and, collectively, the intervening wall 201 and the split contact 200 may transmit power therethrough. It is also contemplated that the conductive assembly 190 may be used to transmit data signals. For example, embodiments may be particularly suitable for application in which the data signals are transmitted at slower speeds, such as 500 megabits per second (Mbps) or less. For embodiments that include a larger component, such as a ground wall, a receptacle cage, a conductor, and/or the like, the conductive assembly 190 may include the larger component. For example, in some embodiments, the conductive assembly 190 includes a receptacle cage, such as the receptacle cage 102 (FIG. 1). The split contact 200 may be part of a cage wall and the intervening wall may be a bottom wall of the receptacle cage. In such embodiments, the conductive assembly 190 may be configured to surround or shield an electrical connector or other electrical device.

The split contact 200 includes a base portion 202 and first and second fingers 220, 230 that are coupled to the base portion 202 and extend in a mounting direction 205 from the base portion 202 to respective distal ends 222, 232. In some embodiments, the base portion 202 may be a portion of a cage wall, such as the inner cage wall 116 (FIG. 1) or a portion of another ground structure, such as the ground conductor 160 (FIG. 2). In some embodiments, a plurality of split contacts 200 may extend from the same base portion 202. Optionally, the split contacts 200 and base portion 202 may be portions of a ground wall (e.g., cage wall) or a shielding structure. For example, the split contacts 200 and the base portion 202 may be stamped from a common sheet of conductive material.

The intervening wall 201 includes first and second openings 252, 254 that form an opening pair 250. The first and second openings 252, 254 are separated by a partition segment 256 of the intervening wall 201. As shown, the first and second fingers 220, 230 extend through the first and second openings 252, 254, respectively. The partition segment 256 of the opening pair 250 is disposed within a receiving gap 240 between the first and second fingers 220, 230.

The split contact 200 is oriented with respect to a longitudinal axis 212 that extends generally parallel to and between the first and second fingers 220, 230. At different points along the longitudinal axis 212, the longitudinal axis 212 may be equi-spaced between the first and second fingers 220, 230. For example, with respect to FIG. 3, the first and second fingers 220, 230 may be symmetrical relative to a plane that extends through the longitudinal axis 212 and bisects the split contact 200.

The first and second fingers 220, 230 are physically discrete elements that are only coupled to each other through the base portion 202. Unlike an eye-of-needle (EON) contact, which includes separate beam portions that are joined to each other at each end, the first and second fingers 220, 230 are distinct elements. More specifically, the first and second fingers 220, 230 are distinct elements from the base portion 202 to the respective distal ends 222, 232. Unlike the EON contacts, the first and second fingers 220, 230 from the base portion 202 to the respective distal ends 222, 232 are not joined by being part of a continuous piece of material of the split contact 200. For instance, even if the distal ends 222, 232 physically engage each other when the first and second fingers 220, 230 are deflected toward one another by a plated thru-hole, the distal ends 222, 232 may be separated after the first and second fingers 220, 230 are removed from the plated thru-hole. Thus, the first and second fingers 220, 230 may be characterized as being physically discrete even if the first and second fingers 220, 230 engage each other proximate to the respective distal ends 222, 232.

The first finger 220 has an inner edge 223 and an outer edge 224 that face in generally opposite directions. It is understood that the inner and outer edges 223, 224 may be part of a single continuous edge that extends from the base portion 202 to the distal end 222 along the inner edge 223 and then back to the base portion 202 along the outer edge 224. The inner and outer edges 223, 224 join each other at the distal end 222. The outer edge 224 represents a portion of the continuous edge that generally faces or directly engages another component, such as a plated thru-hole of a circuit board. Each of the inner and outer edges 223, 224 extends from the base portion 202 to the distal end 222. More specifically, the inner edge 223 extends from a bridge edge 291 that joins the first and second fingers 220, 230 to the distal end 222. The outer edge 224 extends from an outer base edge 292 to the distal end 222. The inner edge 223 represents a portion of the continuous edge that generally faces the other second finger 230.

Similarly, the second finger 230 has an inner edge 233 and an outer edge 234 that face in generally opposite directions. Again, it is understood that the inner and outer edges 233, 234 may be part of a single continuous edge. Each of the inner and outer edges 233, 234 extends from the base portion 202 to the distal end 232. More specifically, the inner edge 233 extends from the bridge edge 291 to the distal end 232, and the outer edge 234 extends from an outer base edge 293 to the distal end 232. The outer edge 234 is configured to engage the other component.

The outer edges 224, 234 and/or the inner edges 223, 233 may have non-linear profiles. The inner edges 223, 233 define a receiving gap 240 therebetween. In other embodiments, however, the outer edges 224, 234 and/or the inner edges 223, 233 may be substantially linear. A separation distance 242 of the receiving gap 240 may be measured between the inner edges 223, 233 along an axis that is perpendicular to the longitudinal axis 212. The separation distance 242 may vary as the first and second fingers 220, 230 extend between the base portion 202 and the distal ends 222, 232. As described below, the first and second fingers 220, 230 may be configured to engage the intervening wall 201. The first and second fingers 220, 230 may engage the intervening wall 201 prior to engaging the other component or may engage the intervening wall 201 as the first and second fingers 220, 230 engage the other component during a coupling operation.

During a positioning operation, the first and second fingers 220, 230 are inserted through the first and second openings 252, 254, respectively. During a coupling operation, the first and second fingers 220, 230 engage the other component. During the positioning operation and/or the coupling operation, the first and second fingers 220, 230 may be shaped to facilitate being deflected toward each other and/or may be shaped to facilitate being deflected away from each other. For example, the first and second fingers 220, 230 may have inner sloped portions 262, 272, respectively. The inner edge 223 includes the inner sloped portion 262. The inner sloped portion 262 is proximate to the corresponding distal end 222. The inner edge 233 includes the inner sloped portion 272, which is proximate to the corresponding distal end 232. The inner sloped portions 262, 272 may be configured to engage the partition segment 256 during the positioning operation. More specifically, one or both of the inner sloped portions 262, 272 may engage the partition segment 256 as the first and second fingers 220, 230 are inserted through the first and second openings 252, 254, respectively. When the inner sloped portions 262, 272 engage the partition segment 256, the first and second fingers 220, 230 are deflected away from each other such that the separation distance 242 increases.

Alternatively or in addition to the inner sloped portions 262, 272, the first and second fingers 220, 230 may have outer sloped portions 264, 274. The outer sloped portions 264, 274 may be configured to engage the other component or engage the intervening wall 201. For example, the first and second openings 252, 254 may be defined by interior edges 276, 278, respectively. Each of the interior edges 276, 278 opposes the partition segment 256. The outer sloped portions 264, 274 may engage the interior edges 276, 278, respectively, as the first and second fingers 220, 230 are inserted through the first and second openings 252, 254, respectively. When the outer sloped portions 264, 274 engage the respective interior edges 276, 278, the first and second fingers 220, 230 may be deflected toward each other such that the separation distance 242 decreases. An example in which the outer sloped portions 264, 274 engage the other component is described below with respect to FIG. 4.

FIG. 4 is a side view of the split contact 200 after the first and second fingers 220, 230 have been inserted into the plated thru-hole 286 of the circuit board 280. The circuit board 280 includes opposite board surfaces 282, 284 and the plated thru-hole 286. The plated thru-hole 286 extends through an entire thickness 285 of the circuit board 280 such that the plated thru-hole 286 opens to the board surface 282 and opens to the board surface 284. Optionally, the plated thru-hole 286 may be a buried via that does not open to the board surface 284. It should be understood that the thickness 285 is only exemplary in FIG. 4. The thickness 285 may be thicker or thinner in other embodiments.

The first and second fingers 220, 230 are configured to be deflected toward each other. During a coupling operation, the first and second fingers 220, 230 are aligned with the plated thru-hole 286 and advanced toward the circuit board 280 in the mounting direction 205. The outer sloped portions 264, 274 of the first and second fingers 220, 230 may engage a hole edge 287 that defines an opening to the plated thru-hole 286. As the split contact 200 continues to advance toward the circuit board 280, the first and second fingers 220, 230 are deflected toward each other. As the first and second fingers 220, 230 are deflected toward each other, a split width 290 of the split contact 200 decreases and the first and second fingers 220, 230 are permitted to advance into the plated thru-hole 286. The split width 290 is measured between the outer edges 224, 234. In some embodiments, the first and second fingers 220, 230 may be deformed as the split contact 200 continues to move in the mounting direction 205. As such, the split contact 200 may mechanically and electrically engage the plated thru-hole 286.

Also shown in FIG. 4, the inner edges 223, 233 of the first and second fingers 220, 230 may engage the partition segment 256 when the split contact 200 is mechanically and electrically engaged to the plated thru-hole 286. For embodiments in which the intervening wall 201 is electrically conductive and the split contact 200 is electrically coupled to a ground structure (not shown), the split contact 200 may electrically common the intervening wall 201 and the ground structure. For example, the split contacts 125 may electrically common the bottom wall 115 (FIG. 1) to the cage walls 111-114 and 116 (FIG. 1).

In some embodiments, the inner edges 223, 233 engage the partition segment 256 only after the first and second fingers 220, 230 are deflected toward each other. In other embodiments, however, the first and second fingers 220, 230 may engage the partition segment 256 before the first and second fingers 220, 230 engage the other component. For example, the first and second fingers 220, 230 may be biased to engage the partition segment 256 therebetween. For example, the first and second fingers 220, 230 may be deflected toward each other prior to the coupling operation or may be shaped to extend toward each other and engage the partition segment 256. In such embodiments, the split contact 200 may be electrically coupled to the intervening wall 201 prior to the coupling operation.

Alternatively or in addition to the first and second contact fingers 220, 230 being shaped to extend toward and engage the partition segment 256, the partition segment 256 may have a partition width 258 that is greater than the separation distance 242 between the inner edges 223, 233. Although not shown in FIG. 4, the partition segment 256 may have a partition width 258 in some embodiments that is greater than the separation distance 242 when the first and second fingers 220, 230 are in relaxed conditions such that the partition segment 256 deflects the first and second fingers 220, 230 away from each other.

Accordingly, in various embodiments, the inner edges 223, 233 may directly engage the partition segment 256 therebetween. The inner edges 223, 233 may engage the partition segment 256 prior to or after a coupling operation. In some embodiments, the first and second fingers 220, 230 are deflected toward each other by the other component such that the partition segment 256 is pinched by the inner edges 223, 233. In some embodiments, the first and second fingers 220, 230 and the partition segment 256 may be sized and shaped relative to one another such that the partition segment 256 is pinched by the first and second fingers 220, 230 prior to a coupling operation. For example, in some embodiments, the partition segment 256 may be sized and shaped to engage the inner edges 223, 233 and deflect the first and second fingers 220, 230 away from each other.

Figure 5:
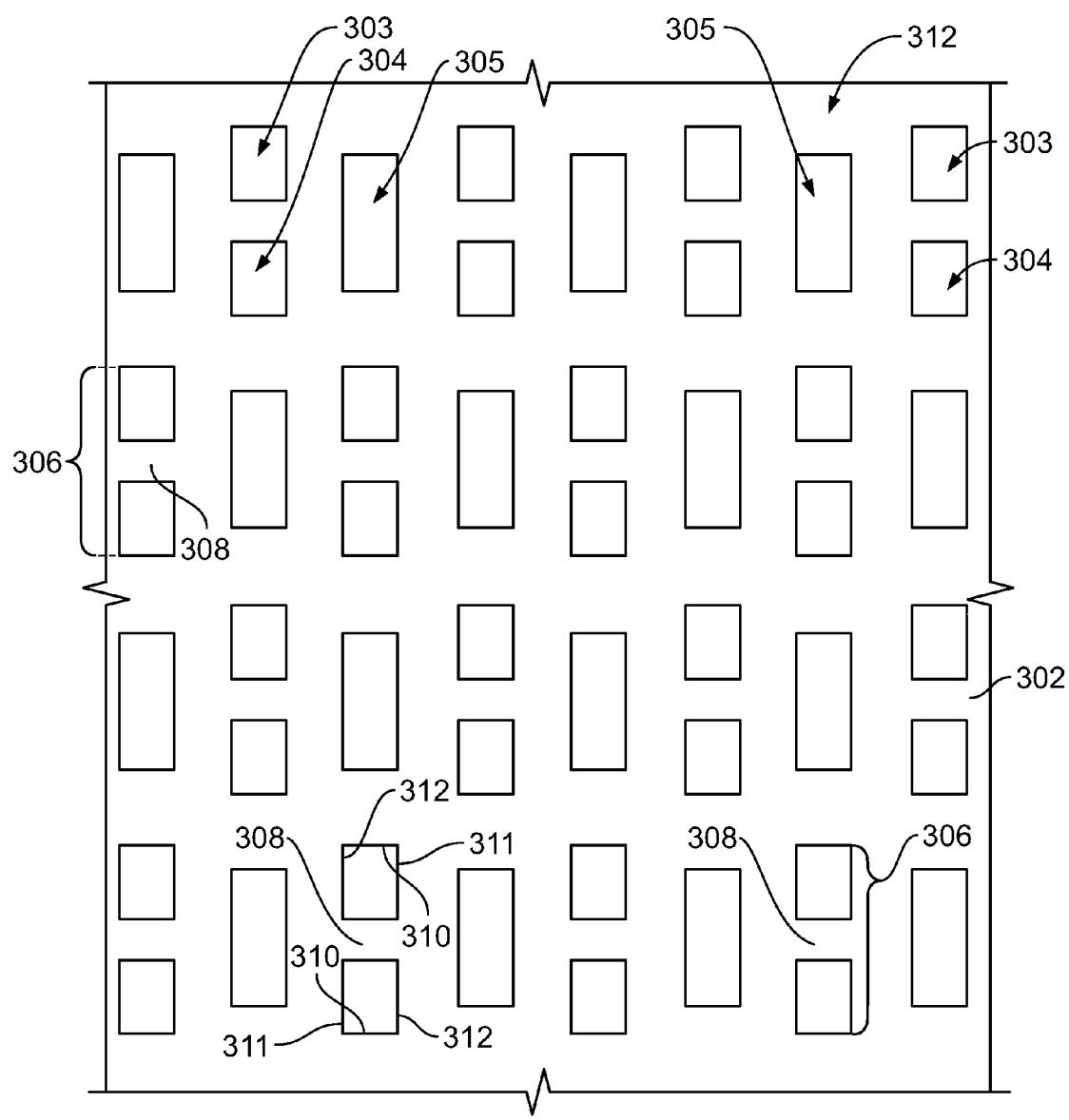
FIG. 5 is a plan view of a portion of an intervening wall in accordance with an embodiment having an array of openings.

FIG. 5 is a plan view of a portion of an intervening wall 302 formed in accordance with an embodiment. In some embodiments, the intervening wall 302 may be a contact organizer that is similar or identical to the contact organizer 154 (FIG. 1). The intervening wall 302 includes an array 312 of openings 303, 304, 305. The openings 303, 304 form a plurality of opening pairs 306. Each opening pair 306 includes one of the openings 303 (hereinafter referred to as a first opening 303) and one of the openings 304 (hereinafter referred to as a second opening 304). The first and second openings 303, 304 of each opening pair 306 are separated by a corresponding partition segment 308. The partition segment 308 is a portion of the intervening wall 302.

For some embodiments, the openings 305 may be referred to as signal openings. Each of the openings 305 is configured to have a conductive terminal or terminals 320 (shown in FIG. 6) inserted therethrough. The first and second openings 303, 304 are configured to have first and second contact fingers 322, 324 (shown in FIG. 6) inserted therethrough. Each of the first and second openings 303, 304 is defined by the partition segment 308, an interior edge 310, and side edges 311, 312.

The array 312 of openings 303-305 may have a designated footprint that is configured to match a contact array 326 (FIG. 6) that includes the conductive terminals 320 and split terminals 318. The conductive terminal 320 may also be referred to as a non-split contact or terminal. The split terminals may also be referred to as split contacts. The contact array 326 may be part of an electrical connector (not shown), such as the electrical connector 152 (FIG. 2). For example, as shown in FIG. 5, the opening pairs 306 are interspersed or positioned within the array 312 such that adjacent openings 305 are separated by opening pairs 306.

Figure 6:
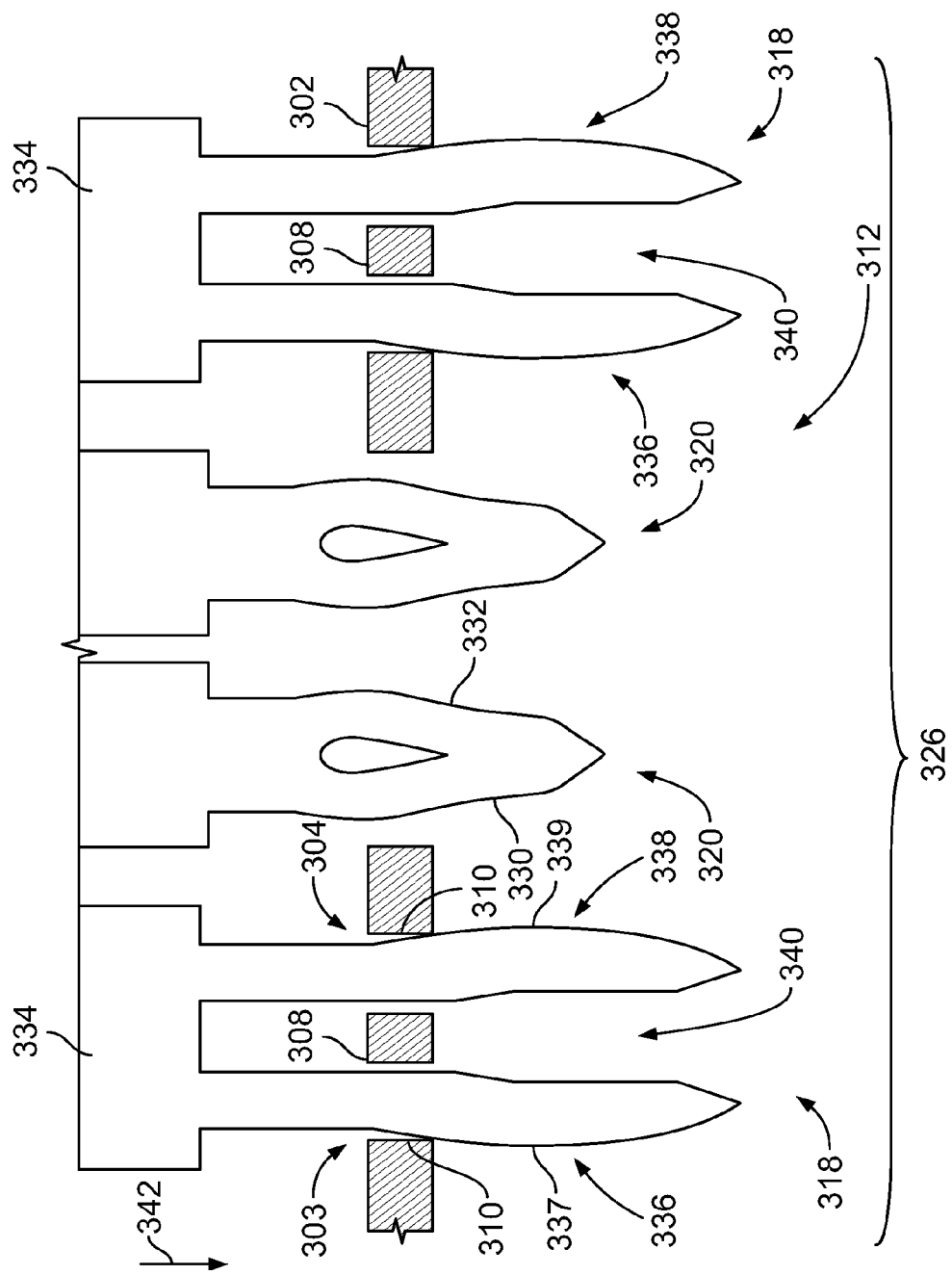
FIG. 6 is a side view of a portion of the intervening wall of FIG. 5 and a portion of a contact array of terminals.

FIG. 6 is a side view of a portion of the intervening wall 302 and a portion of a contact array 312. The contact array 312 includes the split terminals 318 and the conductive terminals 320. The conductive terminals 320 are arranged in pairs, although only one pair of conductive terminals 320 is shown in FIG. 6. The conductive terminals 320 are EON terminals that each have a pair of outer edges 330, 332. The outer edges 330, 332 are configured to mechanically and electrically engage a corresponding plated thru-hole (not shown). In some embodiments, the conductive terminals 320 are configured to transmit data signals. In other embodiments, however, the conductive terminals 320 may be configured to transmit power or function as a ground path.

The split terminals 318 are similar to the split contacts 200 (FIG. 3) in which each split terminal 318 includes a base portion 334 and first and second fingers 336, 338 that extend in a common direction from the base portion 334. As shown, the first and second fingers 336, 338 extend generally parallel to each other from the base portion 334. The first and second fingers 336, 338 have a receiving gap 340 therebetween where the partition segment is disposed. Also shown, the first and second fingers 336, 338 have outer edges 337, 339. In the pre-loaded position shown in FIG. 6, the interior edges 310 of the first and second openings 303, 304 engage the outer edges 337, 339 of the first and second fingers 336, 338. In some embodiments, the intervening wall 302 may be collectively supported by the first and second fingers 336, 338 of the split terminals 318 when the first and second fingers 336, 338 are in relaxed conditions and extend in a gravitational force direction 342. It should be understood, however, that the first and second fingers 336, 338 are not required to extend in the gravitational force direction, but may have various orientations. Instead, the above describes how the first and second fingers 336, 338 may support the weight of the intervening wall 302 when the first and second fingers are in relaxed conditions.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

As used in the description, the phrase "in an exemplary embodiment" and the like means that the described embodiment is just one example. The phrase is not intended to limit the inventive subject matter to that embodiment. Other embodiments of the inventive subject matter may not include the recited feature or structure. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. An electrical connector assembly comprising:
    an electrical connector having a connector side that is configured to interface with another component;
    an intervening wall configured to be positioned along at least one of the connector side or the other component, the intervening wall including a plurality of openings that form opening pairs, each of the opening pairs including first and second openings that are separated by a corresponding partition segment of the intervening wall;
    the other component; and
    a plurality of electrical split contacts, each of the electrical split contacts comprising:
        first and second fingers extending in a mounting direction to respective distal ends, each of the first and second fingers including an inner edge and an outer edge, wherein a receiving gap exists between the inner edges of the first and second fingers;
    wherein the first and second fingers extend through the first and second openings, respectively, of a corresponding opening pair and clear the intervening wall, the partition segment that separates the first and second openings of the corresponding opening pair being disposed within the receiving gap between the first and second fingers;
    wherein at least one of the plurality of electrical split contacts extends from a base portion, the intervening wall being positioned between the base portion and the other component.

2. The electrical connector assembly of claim 1, wherein the inner edges of the first and second fingers are configured to engage the partition segment therebetween.

3. The electrical connector assembly of claim 1, wherein the inner edges of the first and second fingers engage and pinch the partition segment therebetween when the first and second fingers are deflected toward each other.

4. The electrical connector assembly of claim 1, wherein the electrical split contacts are stamped from conductive sheet material.

5. An electrical connector assembly comprising:
    an electrical connector having a connector side that is configured to interface with another component;
    an intervening wall configured to be positioned along at least one of the connector side or the other component, the intervening wall including a plurality of openings that form opening pairs, each of the opening pairs including first and second openings that are separated by a corresponding partition segment of the intervening wall; and
    a plurality of electrical split contacts, each of the electrical split contacts comprising:
        first and second fingers extending in a mounting direction to respective distal ends, each of the first and second fingers including an inner edge and an outer edge, wherein a receiving gap exists between the inner edges of the first and second fingers;
    wherein the first and second fingers extend through the first and second openings, respectively, of a corresponding opening pair, the partition segment that separates the first and second openings of the corresponding opening pair being disposed within the receiving gap between the first and second fingers;
    the electrical connector assembly further comprising a ground structure having the electrical split contacts, the intervening wall including a conductive material, the electrical split contacts electrically commoning the ground structure and the intervening wall.

6. The electrical connector assembly of claim 1, wherein, for each of the electrical split contacts of said plurality of electrical split contacts, the outer edges of the first and second fingers are configured to engage respective interior edges of the intervening wall as the first and second fingers are inserted through the first and second openings, respectively.

7. The electrical connector assembly of claim 1, wherein, for each of the electrical split contacts of said plurality of electrical split contacts, the first and second fingers are configured, relative to the partition segment, such that the respective inner edges of the first and second fingers engage the partition segment during a positioning operation when the first and second fingers are inserted through the first and second openings, respectively, the first and second fingers being deflected away from each other as the respective inner edges of the first and second fingers engage the partition segment.

8. The electrical connector assembly of claim 1, wherein the intervening wall includes interior edges that define the opening pairs, the interior edges configured to engage the outer edges of the first and second fingers of the electrical split contacts after the first and second fingers are inserted through the first and second openings, respectively, the intervening wall being collectively supported by the first and second fingers when the first and second fingers are in relaxed conditions.

9. The electrical connector assembly of claim 1, wherein the other component includes a circuit board having plated thru-holes, the electrical split contacts being inserted into respective plated thru-holes.

10. An electrical connector assembly comprising:
an electrical connector having a connector side that is configured to interface with another component;
an intervening wall configured to be positioned along at least one of the connector side or the other component, the intervening wall including a plurality of openings that form opening pairs, each of the opening pairs including first and second openings that are separated by a corresponding partition segment of the intervening wall; and
a plurality of electrical split contacts, each of the electrical split contacts comprising:
first and second fingers extending in a mounting direction to respective distal ends, each of the first and second fingers including an inner edge and an outer edge, wherein a receiving gap exists between the inner edges of the first and second fingers;
wherein the first and second fingers extend through the first and second openings, respectively, of a corresponding opening pair, the partition segment that separates the first and second openings of the corresponding opening pair being disposed within the receiving gap between the first and second fingers;
wherein the electrical connector includes a contact array along the connector side, the contact array including electrical non-split contacts and the electrical split contacts, the electrical split contacts being positioned to electrically separate the electrical non-split contacts along the connector side and configured to be inserted into plated thru-holes, the intervening wall being a contact organizer.

11. The electrical connector assembly of claim 10, wherein the contact organizer includes interior edges that define the opening pairs, the interior edges configured to engage the outer edges of the first and second fingers of the electrical split contacts after the first and second fingers are inserted through the first and second openings, respectively, the contact organizer being collectively supported by the first and second fingers when the first and second fingers are in relaxed conditions.

12. The electrical connector assembly of claim 5, wherein the ground structure is a conductive wall.

13. The electrical connector assembly of claim 12, wherein the conductive wall is oriented orthogonal to the intervening wall.

14. The electrical connector assembly of claim 12, wherein the inner edges of the first and second fingers engage the partition segment therebetween.

15. The electrical connector assembly of claim 12, wherein the conductive wall and the electrical split contacts are stamped and formed from a common sheet of conductive material.

16. The electrical connector assembly of claim 12, wherein the conductive wall is a first conductive wall and the electrical connector assembly further comprises a second conductive wall having the electrical split contacts, the electrical split contacts electrically commoning the second conductive wall and the intervening wall.

17. The electrical connector assembly of claim 1, wherein the other component is a circuit board or another electrical connector assembly.

18. The electrical connector assembly of claim 9, wherein the first and second fingers for each of the electrical split contacts of said plurality of electrical split contacts is inserted into the respective plated thru-hole, the respective plated thru-hole deforming the first and second fingers.

* * * * *